United States Patent
Ishizuka et al.

(10) Patent No.: US 6,940,023 B2
(45) Date of Patent: Sep. 6, 2005

(54) PRINTED-WIRING BOARD AND ELECTRONIC DEVICE

(75) Inventors: Naomi Ishizuka, Tokyo (JP); Eiichi Kono, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 10/894,456

(22) Filed: Jul. 16, 2004

(65) Prior Publication Data

US 2004/0262040 A1 Dec. 30, 2004

Related U.S. Application Data

(63) Continuation of application No. PCT/JP03/00259, filed on Jan. 15, 2003.

(51) Int. Cl.[7] .................................. H05K 1/16
(52) U.S. Cl. ................. 174/260; 174/262; 174/263; 361/760; 361/779
(58) Field of Search ............... 174/260, 262, 174/263, 264, 266, 261, 250, 255; 361/761, 791, 792, 795, 763, 772, 773, 779

(56) References Cited

U.S. PATENT DOCUMENTS

| | | | | |
|---|---|---|---|---|
| 5,743,004 A | * | 4/1998 | Chobot et al. | 29/830 |
| 6,521,842 B2 | * | 2/2003 | Brinthaupt et al. | 174/252 |
| 6,849,805 B2 | * | 2/2005 | Honda et al. | 174/250 |

FOREIGN PATENT DOCUMENTS

| | | |
|---|---|---|
| JP | 63-264341 | 11/1988 |
| JP | 03-165093 | 7/1991 |
| JP | 03-165094 | 7/1991 |
| JP | 04-354180 | 12/1992 |
| JP | 06-120667 | 4/1994 |
| JP | 06-232562 | 8/1994 |
| JP | 09-008443 | 1/1997 |
| JP | 10041605 A * | 2/1998 |
| JP | 2001-024297 | 1/2001 |
| JP | 2001-332851 | 11/2001 |

OTHER PUBLICATIONS

Comuter translation of Japanese Publication JP10041605A.*

* cited by examiner

Primary Examiner—Kamand Cuneo
Assistant Examiner—Ishwar (I. B.) Patel
(74) Attorney, Agent, or Firm—Katten Muchin Rosenman LLP

(57) ABSTRACT

The present invention provides a board ensuring no peel-off of a wall and a land, even if a part is soldered to the board with lead-free solder. The board 10 is comprised of N ($N \geq 3$) layer patterns electrically insulated from one another, and is formed with a through-hole 14 into which an electrode 19 of an electronic part 18 is to be inserted. An external land 15 is formed on a surface of each of the first and N-th layer patterns. An electrically conductive layer 17 is formed on an inner wall of the through-hole 14 such that the electrically conductive layer is electrically connected to the external land 15 of each of the first and N-th layer patterns. The electronic part 18 is fixed in the through-hole 14 with lead-free solder 20 filled in the through-hole 14. At least one internal land 16 extending from the electrically conductive layer 17 is formed in the same layer as a M-th layer pattern ($2 \leq M \leq (N-1)$). The internal land 16 is not electrically connected to the M-th layer pattern.

16 Claims, 16 Drawing Sheets

| No. OF CYCLES IN THERMAL IMPACT TEST | CONVENTIONAL CIRCUIT SUBSTRATE | THE FIRST EMBODIMENT |
|---|---|---|
| | LEAD-FREE SOLDER (Sn-Ag) | |
| 0 cyc | ○8 | ○8 |
| 100 cyc | ○8 | ○8 |
| 200 cyc | △1, ○7 | ○8 |
| 300 cyc | ×7, ○1 | ○8 |
| 400 cyc | ×7, ○1 | ○8 |
| 500 cyc | ×8 | ○8 |

FIG.11

| No. OF CYCLES IN THERMAL IMPACT TEST | CONVENTIONAL CIRCUIT SUBSTRATE | |
|---|---|---|
| | TIN-LEAD EUTECTIC SOLDER | LEAD-FREE SOLDER (Sn-Ag) |
| 0 cyc | ○8 | ○8 |
| 100 cyc | ○8 | ○8 |
| 200 cyc | ○8 | △1,○7 |
| 300 cyc | ○8 | ×7,○1 |
| 400 cyc | ○8 | ×7,○1 |
| 500 cyc | ○8 | ×8 |

(a)

(b)

| MATERIAL | COEFFICIENT OF THERMAL EXPANSION | TEMPERATURE |
|---|---|---|
| PRINTED-WIRING BOARD (EPOXY) (X-Y) | 16 | 50→100°C |
| PRINTED-WIRING BOARD (EPOXY) (Z) | 53 | 50→100°C |
| ELECTRONIC PART (POLYAMIDE) | 82 | −30→30°C |
| LEAD-FREE SOLDER (Sn-Ag-Cu) | 22 | 0→100°C |

PRINTED-WIRING BOARD AND ELECTRONIC DEVICE

CROSS-REFERENCE TO RELATED APPLICATION

The present application is a continuation of International Application No. PCT/JP03/00259 which was filed on Jan. 15, 2003 and claims priority under 35 U.S.C. § 119 from Japanese Patent Application No. 2002-009807 which was filed on Jan. 18, 2002.

BACKGROUND OF THE INVENTION

1. Field of the Invention

The invention relates to a printed-wiring board and an electronic device including the printed-wiring board, and more particularly to a printed-wiring board fabricated in accordance with a subtractive process and having an electronic part inserted thereinto, and an electronic device including the printed-wiring board.

2. Description of the Related Art

A subtractive process has been conventionally known as a process for fabricating a printed-wiring board. The subtractive process is most general among processes for fabricating a printed-wiring board.

Hereinbelow is explained a subtractive process for fabricating a printed-wiring board, with reference to FIG. 10. FIG. 10 is a cross-sectional view of a conventional printed-wiring board on which electronic parts are mounted.

As illustrated in FIG. 10, a printed-wiring board 1 is formed with a through-hole 2. An electrode 4a of an electronic part 4 is soldered in the through-hole 2 with tin-lead eutectic solder (Sn: 63 wt %, Pb: 37%).

The printed-wiring board 1 is fabricated as follows.

First, there is fabricated an electrically insulating pre-preg 5 by impregnating a board such as a paper board, a glass board or a polyester-fiber board with resin such as epoxy resin or phenol resin.

Then, a copper foil is fixed onto a surface of the pre-preg 5 by compressing the foil onto the surface or heating the foil on the surface. Thus, the board is covered with the copper foil. Then, the copper foil is etched for fabricating an internal layer pattern 6 in a predetermined region of the board. Thereafter, a portion of the copper foil unnecessary for electrical conduction is removed.

Then, the board covered with the copper foil is sandwiched between the pre-pregs 5. Then, copper foils are placed on surfaces of the pre-pregs 5 sandwiching the board therebetween. Then, the board, the pre-pregs 5 and the copper foils are thermally pressed to fix to one another. The pre-pregs 5 and the copper foils are identical with the previously mentioned pre-preg and copper foil.

Then, the copper foils are etched to thereby fabricate internal layer patterns 6.

The above-mentioned steps are repeatedly carried out a predetermined number of times. Thus, there is fabricated the N-layered printed-wiring board 1.

In FIG. 10, only a first layer L1, a second layer L2, a (N−1)-th layer L(N−1), and a N-th layer LN are illustrated.

After the fabrication of the N-layered printed-wiring board 1, the printed-wiring board is formed the through-hole 2 into which the electronic part 4 is to be inserted.

Then, the through-hole 2 is de-smeared. Herein, "de-smear" means to chemically remove smears (burs) sometimes accompanied with drilling of the through-hole 2.

After having de-smeared the through-hole, an underlying plating layer is formed on an inner wall of the through-hole 2, and then, electrolytic copper plating is carried out to thereby form an electrically conductive layer 2a on an inner wall of the through-hole 2. The copper foils fixed on surfaces of the first and N-th layers L1 and LN are electrically connected to each other through the electrically conductive layer 2a.

After the fabrication of the electrically conductive layer 2a, the copper foils fixed on surfaces of the first and N-th layers L1 and LN are etched to thereby form external surface patterns 7 and external surface lends 7a.

Then, solder resist 8 is coated on surfaces of the first and N-th layers L1 and LN such that the tin-lead eutectic solder 3 is not adhered to areas other than area to which the tin-lead eutectic solder 3 is to be soldered. Then, the solder resist 8 is exposed to light.

As mentioned above, when the printed-wiring board 1 is fabricated in accordance with a subtractive process, the solder resist 8 is coated on surfaces of the first and N-th layers L1 and LN only in areas in which the external surface lands 7a are to be formed, and thus, the solder resist 8 protects the external surface patterns 7 other than the external surface lands 7a on which the electrode 4a of the electronic part 4 is to be mounted.

In the conventional printed-wiring board 1 fabricated in accordance with a subtractive process, with respect to layers which are not necessary to be electrically connected to other layers, among internal layers comprised of the second layer L2 to the (N−1)-layer L(N−1), internal layer patterns 6 around the through-hole 2 are partially removed by etching, keeping a sufficient clearance therebetween such that the internal layer patterns 6 are not exposed to the through-hole 2.

Accordingly, in the internal layers not electrically connected to other layers, the electrically conductive layer 2a and the electrically insulating pre-pregs 5 are adhered to each other merely by virtue of anchor effect caused by plating. Hence, assuming the electrically conductive layer 2a makes contact with the pre-pregs 5 by a length (hereinafter, referred to as "contact-length L"), a longer contact-length would cause a higher stress between the electrically conductive layer 2a and the pre-pregs 5, when a high shearing stress is generated due to thermal expansion of them.

This causes defects in electrical connection in the through-hole 2 in the case that the electrode 4a of the electronic part 4 is inserted into the through-hole 2 through the use of solder having a high melting point (for instance, as mentioned later, lead-free solder). Hence, whereas it is not necessary to prepare countermeasures to defects in electrical connection in the through-hole 2, if tin-lead eutectic solder 3 is used, it was necessary to prepare countermeasures to defects in electrical connection in the through-hole 2, if solder having a high melting point is used.

For instance, Japanese Patent Application Publications Nos. 3-165093, 3-165094, 63-264341, 4-354180, 6-120667 and 2001-24297 have suggested printed-wiring boards including countermeasures to defects in electrical connection in the through-hole 2.

In recent years, lead-free solder is mainly selected in place of lead-containing solder in order to prevent environmental pollution caused by lead.

As mentioned later in detail, the inventors found out that when an electronic part is mounted on a printed-wiring board by means of solder having a high melting point, in particular, lead-free solder, there are caused many problems such as peeling-off of the electrically conductive layer 2a. However, in the printed-wiring boards having been suggested in the above-mentioned Publications, influence which solder having a high melting point, in particular, lead-free solder exerts on reliability of the printed-wiring boards is not suggested and considered at all.

Lead-free solder contains tin as a primary constituent, and further contains silver, copper, zinc, bismuth, indium, antimony, nickel, germanium and so on. In comparison with tin-lead (Sn—Pb) eutectic solder (Sn: 63 wt %, Pb: 37 wt %) most frequently used for soldering in electronic parts, lead-free solder has higher tensile strength and creep strength, and smaller elongation.

Hence, stress relaxation is unlikely to be caused in lead-free solder in comparison with lead-containing solder. In addition, with respect to a melting point, whereas tin-lead eutectic solder has a melting point of 183 degrees centigrade, lead-free solder has a melting point in the range of 190 to 230 degrees centigrade, which is higher than the melting point of tin-lead eutectic solder.

As lead-free solder presently much used, there are tin-zinc (Sn—Zn) solder, tin-copper (Sn—Cu) solder and tin-silver (Sn—Ag) solder.

Tin-zinc (Sn—Zn) solder contains Sn—9.0 wt % Zn, eutectic composition of tin and zinc, as a principal constituent, in which zinc may be varied in an amount, and further contains other elements to have improved characteristics. A typical example of tin-zinc (Sn—Zn) solder is Sn—8.0Zn—3.0Bi.

Tin-copper (Sn—Cu) solder contains Sn—0.7 wt % Cu, eutectic composition of tin and copper, as a principal constituent, in which copper may be varied in an amount, and further contains other elements to have improved characteristics. A typical example of tin-copper (Sn—Cu) solder is Sn—0.7Cu—0.3Ag.

Tin-silver (Sn—Ag) solder contains Sn—3.5 wt % Ag, eutectic composition of tin and silver, as a principal constituent, in which silver may be varied in an amount, and further contains other elements to have improved characteristics. A typical example of tin-silver (Sn—Ag) solder is Sn—3.0Ag—0.5Cu or Sn—3.5Ag—0.75Cu.

However, the above-mentioned lead-free solders are accompanied with a problem that when high shearing stress is caused by thermal expansion in lead-free solders having a high melting point, the electrically conductive layer 2a and the electrically insulating pre-pregs 5 are peeled off each other, that is, peeling-off of walls is caused at a possibility ten or more times greater than conventional tin-lead eutectic solder.

In addition, in the first and N-th layers as external layers of the printed-wiring board 1, the pre-pregs 5 and the external surface lands 7a may be peeled off each other, that is, peeling-off of lands may be caused, resulting in that the external surface pattern 7 electrically connected to the external surface lands 7a may be disconnected due to thermal stress.

For the reasons mentioned above, when the electrode 4a of the electronic part 4 was soldered in the through-hole 2 with lead-free solder, it was necessary to check reliability of the printed-wiring board 1 and areas in which the electrode was soldered to the through-hole.

The inventors carried out reliability test to the conventional printed-wiring board 1. Specifically, after the electronic part 4 such as a connector composed of resin such as polyamide was flow-soldered in the through-hole with lead-free solder, temperature-cycle test as lifetime test was carried out to the conventional printed-wiring board 1. The result was that disconnection or breakage was likely to be found early, in particular, in the through-hole 2 having no electrical conduction with the internal layer patterns 6.

Polyamide is a resin having a higher coefficient of thermal expansion than the same of the printed-wiring board 1 in X-Y direction. The temperature-cycle test was carried out at a cycle of −40 degrees centigrade (30 minutes), 25 degrees centigrade (5 minutes), and 125 degrees centigrade (30 minutes).

The above-mentioned disconnection is explained hereinbelow with respect to a conventional four-layered printed-wiring board, for instance.

The conventional four-layered printed-wiring board corresponds to the printed-wiring board 1 illustrated in FIG. 10 wherein the N-th layer is a fourth layer and the (N−1)-layer is a third layer, and second and third layers are not electrically connected to the electrically conductive layer 2a, and thus, the through-hole 2 merely passes through the pre-pregs 5 in the second and third layers.

It was found out that whereas the conventional tin-lead eutectic solder 3 hardly exerted influence on reliability of the printed-wiring board 1, lead-free solder having a high melting point caused defects in electrical connection which were not found in the conventional tin-lead eutectic solder 3, and hence, explicitly exerted influence on reliability of the printed-wiring board 1.

Hereinbelow, the above-mentioned matter is explained.

FIG. 11 shows the results of the thermal stress cycle test having been carried out to both the conventional printed-wing board 1 in which the tin-lead eutectic solder 3 was used and the conventional printed-wiring board 1 in which the lead-free solder was used.

In the thermal stress cycle test, an electronic part was fixed to the conventional printed-wiring board 1 with the tin-lead eutectic solder 3 and lead-free solder (Sn—Ag), respectively, under the same conditions, and thereafter, the thermal stress cycle test in which a cycle of −40 degrees centigrade (30 minutes), 25 degrees centigrade (5 minutes), 125 degrees centigrade (30 minutes) and 25 degrees centigrade (5 minutes) was repeated was carried out to the printed-wiring board 1. The numbers of the cycles having been carried out until the disconnection was caused were compared to each other.

In FIG. 11, "○" indicates that a resistance was not varied, "Δ" indicates that a resistance raised, and "X" indicates that the disconnection was caused.

The electronic part 4 was mounted on the external surface pattern 7 electrically connecting the external surface lands 7a to each other, and an electrical resistance across the external surface lands 7a was observed. The disconnection was judged to occur when the electrical resistance became infinite.

The number of test samples was eight. For instance, "○8" indicates that a resistance was not varied in all of the eight test samples, and "X7, ○1" indicates that the disconnection was found in seven test samples among the eight test samples and a resistance was not varied in the rest of the test samples.

As shown in FIG. 11, in the conventional printed-wiring board 1 to which a part was soldered with lead-free solder, an electrical resistance raised when the cycle number of thermal impact test was 200 (a resistance raised in the one test sample, and a resistance was not varied in the seven test samples), and the disconnection was caused in almost all of the test samples when the cycle number of thermal impact test was 300 (a resistance raised in the seven test samples, and a resistance was not varied in the one test sample). Thus, it was found out that the disconnection was likely to be caused early, if a part was soldered to the printed-wiring board with lead-free solder rather than lead-containing solder.

FIG. 12 is an enlarged cross-sectional view of a corner of the through-hole 2 observed after the thermal stress cycle test was carried out to the conventional printed-wiring board 1 including lead-free solder.

The thermal stress cycle test was carried out 300 cycles to the conventional printed-wiring board 1 including lead-free solder. One cycle is comprised of −40 degrees centigrade (80 minutes), room temperature (5 minutes), 125 degrees centigrade (30 minutes) and room temperature (5 minutes).

As illustrated in FIG. 12, it was found out that there was generated big crack CR throughout the lead-free solder 9 at a corner 2b of the through-hole 2 covered with the lead-free solder 9, and hence, the disconnection was caused in the external surface pattern 7.

In addition, it was found out that there was generated big peeling-off of wall WP between the electrical conductive layer 2a and the pre-pregs 5 with the result that the electrical conductive layer 2a was peeled off the pre-pregs 5, and there was also generated a crack CR starting from the wall peeling-off WP.

Specifically, as a result of the generation of the wall peeling-off WP between the electrically conductive layer 2a and the pre-pregs 5, the crack CR was generated at the corner 2b of the through-hole 2, and resultingly, the disconnection was caused in the external surface pattern 7 The disconnection significantly reduces reliability of an electronic device including the conventional printed-wiring board 1 in which the lead-free solder 9 is used.

FIG. 13 shows a proportion defective of the conventional printed-wiring board 1 including lead-free solder.

FIG. 13(a) is a graph showing a proportion defective of each of parts, and FIG. 13(b) is a table showing a proportion defective of each of parts.

In FIG. 13, there are shown a rate at which peeling-off of wall is generated, measured immediately after three connectors A, B and C were soldered to the conventional printed-wiring board 1 with lead-free solder, and a rate at which crack is generated, measured after the above-mentioned temperature cycle test was carried out 500 times. The rates were measured by observing a cross-section of an area in which the connectors were soldered to the printed-wiring board.

As shown in FIG. 13, a rate at which peeling-off of wall is generated and a rate at which crack is generated are almost 100% with respect to the connector A composed of polyamide. A rate at which peeling-off of wall is generated is almost 72%, and a rate at which crack is generated is almost 78% with respect to the connector B composed of polybutadieneterephthalate. A rate at which peeling-off of wall is generated is almost 5%, and a rate at which crack is generated is almost 0% with respect to the connector C composed of liquid crystal polymer.

It was experimentally found out in view of the results shown in FIG. 13 that a connector having a higher rate at which wall peeling-off WP was generated immediately after the connector was soldered to the printed-wiring board had a higher possibility at which crack CR was generated after the temperature cycle test was carried out 500 cycles, and hence, the crack CR and the wall peeling-off WP in the corner 2b of the through-hole 2 had explicit correlation with each other.

FIG. 14(a) is a cross-sectional view showing a cause by which crack is generated in the conventional printed-wiring board 1 including lead-free solder, and FIG. 14(b) shows coefficients of thermal expansion of a printed-wiring board composed of epoxy, the electronic part 4, and the lead-free solder 9.

As shown in FIG. 14(b), the electronic part 4 mounted on the printed-wiring board 1 is composed of polyamide resin having a much difference in a coefficient of thermal expansion with the printed-wiring board 1, similarly to the connector A (see FIG. 13). The electrode 4a of the electronic part 4 has a square cross-section having sides each of which is 0.5 mm or longer.

In the electronic part 4, the wall peeling-off is generated between the electrically conductive layer 2a and the pre-pregs 5 in areas located close to the external surface layers (see FIG. 12). In addition, it is readily considered that if thermal stress is repeatedly exerted on the electronic part during the temperature cycle test, stress is likely to be concentrated to the corner 2b of the through-hole 2 in comparison with a case where the wall peeling-off WP is not generated, and hence, the crack CR is generated with the result of early disconnection.

Most of the electronic parts 4 having a high rate at which the wall peeling-off WP is generated is a connector to be connected to a power source. It is quite difficult to design a connector to have the electrode 4a having a small diameter in order to ensure a constant current density. In addition, a connector is quite often composed of polyamide, because it is cheap and can be readily processed.

Accordingly if the electronic part 4 is soldered to a printed-wiring board with the lead-free solder 9, it is considered that the crack CR is caused at the corner 2b of the through-hole 2 at a quite high possibility due to the wall peeling-off WP. Needless to say, if the crack CR is caused at the corner 2b of the through-hole 2, reliability of the electronic part 4 would be much reduced.

In the conventional printed-wiring board 1, there are caused not only the wall peeling-off WP, but also peeling-off of a land LP between the external surface lands 7a and the pre-pregs 5.

FIG. 15 is an enlarged cross-sectional view of an area in which peeling-off of land LP is generated in the conventional printed-wiring board 1 including the lead-free solder 9.

As illustrated in FIG. 15, in the conventional printed-wiring board 1 including the lead-free solder 9, the external surface land 7a is peeled off the pre-pregs 5, that is, peeling-off of land LP is generated, because the lead-free solder 9 has a high solidifying point.

If the land peeling-off LP is generated, the external surface pattern 7 mechanically and electrically connected to the external surface land 7a is much twisted, and hence, floated. Under such condition, if the external surface pattern 7 connected to the external surface land 7a is thermally stressed, disconnection would be readily caused in the external surface pattern 7. The land peeling-off LP causes disconnection defectiveness which exerts harmful influence on reliability of the printed-wiring board 1.

Among the wall peeling-off WP, the crack CR and the land peeling-off LP both generated at the corner 2b of the through-hole 2, which are all generated in the conventional printed-wiring board 1 including the lead-free solder 9, if the wall peeling-off WP and the crack CR are generated in particular, it would be quite difficult to identify where they are generated and find out defective printed-wiring boards.

This is because, whereas the land peeling-off LP is generated at surfaces of the first and N-th layers, and hence, can be visually found out, the wall peeling-off WP and the crack CR are generated in the through-hole 2 or at the corner 2b of the through-hole 2 covered with solder fillet, they cannot be visually found out.

FIG. 16 shows simultaneous generation of the wall peeling-off WP and the land peeling-off LP in the conventional printed-wiring board 1 including the lead-free solder 9.

As illustrated in FIG. 16, the electrode 4a of the electronic part 4 is soldered in the through-hole 2 of the printed-wiring board 1 with the lead-free solder 9. In the printed-wiring board 1, there is generated wall peeling-off WP, that is, the electrically conductive layer 2a is peeled off the pre-pregs 5, and there is further generated land peeling-off LP, that is, the external surface land 7a is peeled off the pre-pregs 5.

That is, if the electronic part 4 is composed of polyamide resin quite different from the printed-wiring board 1 with respect to a coefficient of thermal expansion, and the electrode 4a having a square cross-section having sides each having a length of 0.5 mm or greater is soldered in the through-hole with the lead-free solder 9, the wall peeling-off WP and the land peeling-off LP may be simultaneously generated due to the causes, respectively.

The wall peeling-off WP is primarily caused by a difference in a coefficient of thermal expansion or contraction between the printed-wiring board 1 ad the electronic part 4 in directions of X-Y axes, and the land peeling-off LP is primarily caused by a difference in timing between thermal expansion or contraction of the printed-wiring board 1 in a Z-axis direction and solidification of the lead-free solder 9 dependent on a high melting point of the lead-free solder 9. If the wall peeling-off WP and the land peeling-off LP are simultaneously generated, continuous peeling-off would be generated between the external surface land 7a and the electrically conductive layer 2a.

As explained above, when the electronic part 4 is soldered to the conventional printed-wiring board 1 with the lead-free solder 9, the wall peeling-off WP and the land peeling-off LP may be simultaneously generated, in which case, reliability of the printed-wiring board 1 is reduced. The same as mentioned above is applied to an electronic device including the electronic part 4 soldered to the conventional printed-wiring board 1 with the lead-free solder 9.

SUMMARY OF THE INVENTION

In view of the above-mentioned problems in the conventional printed-wiring board 1, it is an object of the present invention to provide a reliable printed-wiring board and electronic part both of which are capable of preventing defectiveness of wall peeling-off and land peeling-off, even if lead-free solder is used for soldering a part to a printed-wiring board.

The present invention provides a board having a multi-layered pattern structure comprised of N layer patterns electrically insulated from one another wherein N is an integer equal to or greater than 3, wherein the multi-layered pattern structure is formed with a through-hole into which an electrode of an electronic part is to be inserted, an external land is formed on a surface of each of the first and N-th layer patterns, an electrically conductive layer is formed on an inner wall of the through-hole such that the electrically conductive layer is electrically connected to the external land of each of the first and N-th layer patterns, the electronic part is fixed in the through-hole with lead-free solder filled in the through-hole, and at least one internal land extending inwardly of the multi-layered pattern structure from the electrically conductive layer is formed in the same layer as a M-th layer pattern ($2 \leq M \leq (N-1)$) such that the internal land is not electrically connected to the M-th layer pattern.

In accordance with the above-mentioned printed-wiring board, there is formed at least one internal land not electrically connected to an internal layer pattern, ensuring reduction in a distance between the internal land the external land. Thus, even if an electronic part is soldered to the printed-wiring board with lead-free solder, it is possible to prevent generation of wall peeling-off and land peeling-off.

The internal land may be in the form of a ring including the through-hole as a central opening.

It should be noted that the internal land may be in any planar shape, if the internal land can shorten a distance from the external land, and can prevent generation of wall peeling-off. For instance, the internal land may be comprised of a combination of lines and curves.

It is preferable that the internal land has a width equal to or greater than about 0.10 mm and equal to or smaller than 1.5 R wherein the width is defined as a difference between a radius of the through-hole and an outer radius of the internal land and R indicates a radius of the through-hole.

The width of the internal land is preferably equal to or greater than about 0.125 mm, and more preferably, equal to or greater than about 0.175 mm.

It is preferable that at least one of a distance in a length-wise direction of the through-hole between the first layer pattern and the internal land formed in the same layer as the second layer pattern, and a distance in a length-wise direction of the through-hole between the N-th layer pattern and the internal land formed in the same layer as the (N−1)-th layer pattern is equal to or smaller than 0.5 mm.

It is preferable that a distance in a length-wise direction of the through-hole between adjacent internal lands is equal to or smaller than a diameter of the through-hole.

The internal land may be formed only in the same layer as the second layer pattern.

The internal land may be formed in the same layers as the second and the (N−1)-th layer patterns.

It is preferable that the external land is at least partially covered at an end thereof with solder resist.

For instance, the multi-layered pattern structure may be fabricated in accordance with a subtractive process.

The above-mentioned printed-wiring board may be applied to an electronic device, for instance.

The advantages obtained by the aforementioned present invention will be described hereinbelow.

The printed-wiring board in accordance with the present invention is designed to have at least one internal surface land having no electrical connection with an internal surface pattern, and thus, shortens a distance between the internal surface land and the external surface land. Accordingly, even if an electronic device is soldered to the printed-wiring board with lead-free solder, it would be possible to prevent generation of wall peeling-off and land peeling-off. Thus, the present invention provides highly reliable printed-wiring board and electronic device.

The above and other objects and advantageous features of the present invention will be made apparent from the following description made with reference to the accompanying drawings, in which like reference characters designate the same or similar parts throughout the drawings.

BRIEF DESCRIPTION OF THE DRAWINGS

FIG. 3(a) is a cross-sectional view on the assumption that wall peeling-off is generated, and FIG. 3(b) is a cross-sectional view on the assumption that wall peeling-off is not generated.

FIG. 4 is a table showing the results of a thermal stress cycle test carried out to the printed-wiring board in accordance with the first embodiment, illustrated in FIG. 1, including lead-free solder, and a conventional printed-wiring board including lead-free solder.

FIG. 11 shows the results of a thermal stress cycle test carried out to both a conventional printed-wiring board in which tin-lead eutectic solder is used and a conventional printed-wiring board in which lead-free solder is used.

DESCRIPTION OF THE PREFERRED EMBODIMENTS

Preferred embodiments in accordance with the present invention will be explained hereinbelow with reference to drawings.

(First Embodiment)

Figure 1:
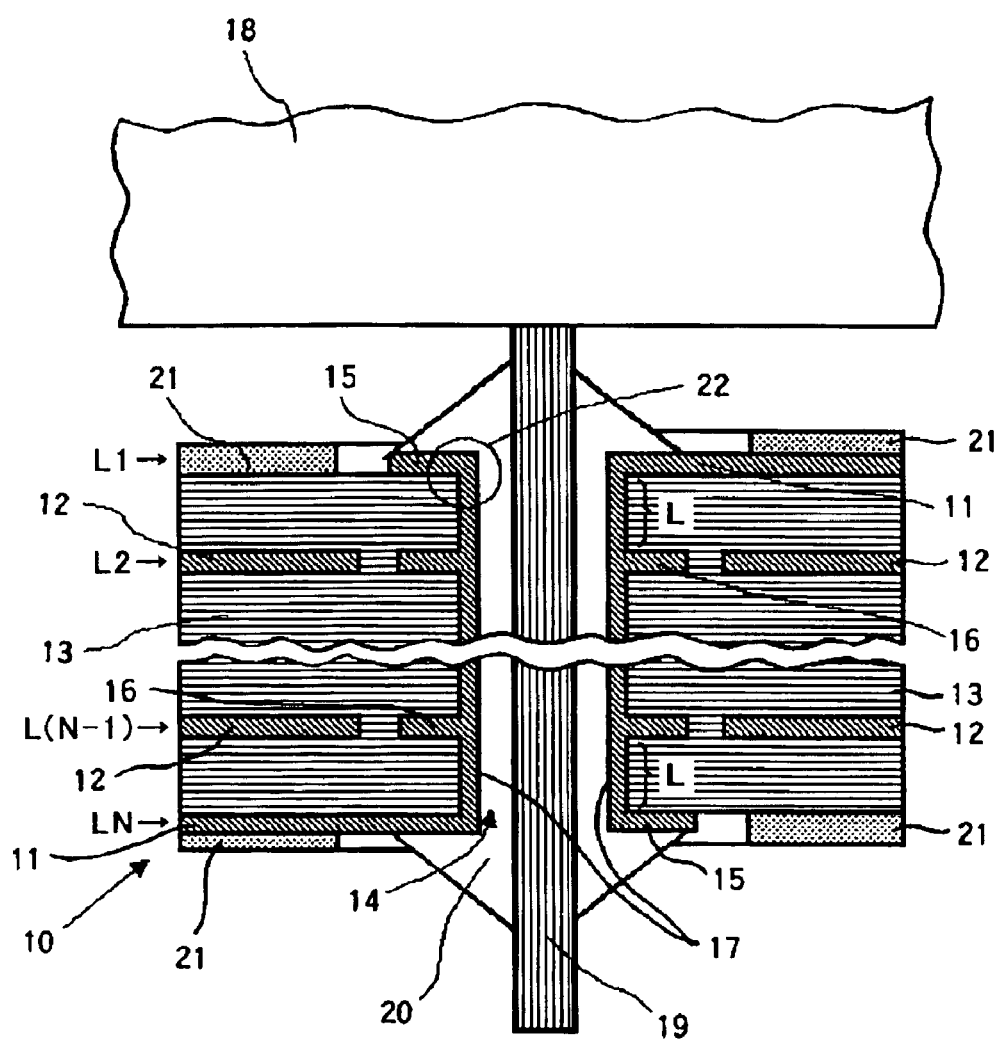
FIG. 1 is a cross-sectional view of a printed-wiring board in accordance with the first embodiment of the present invention, on which an electronic part is mounted.
Figure 2:
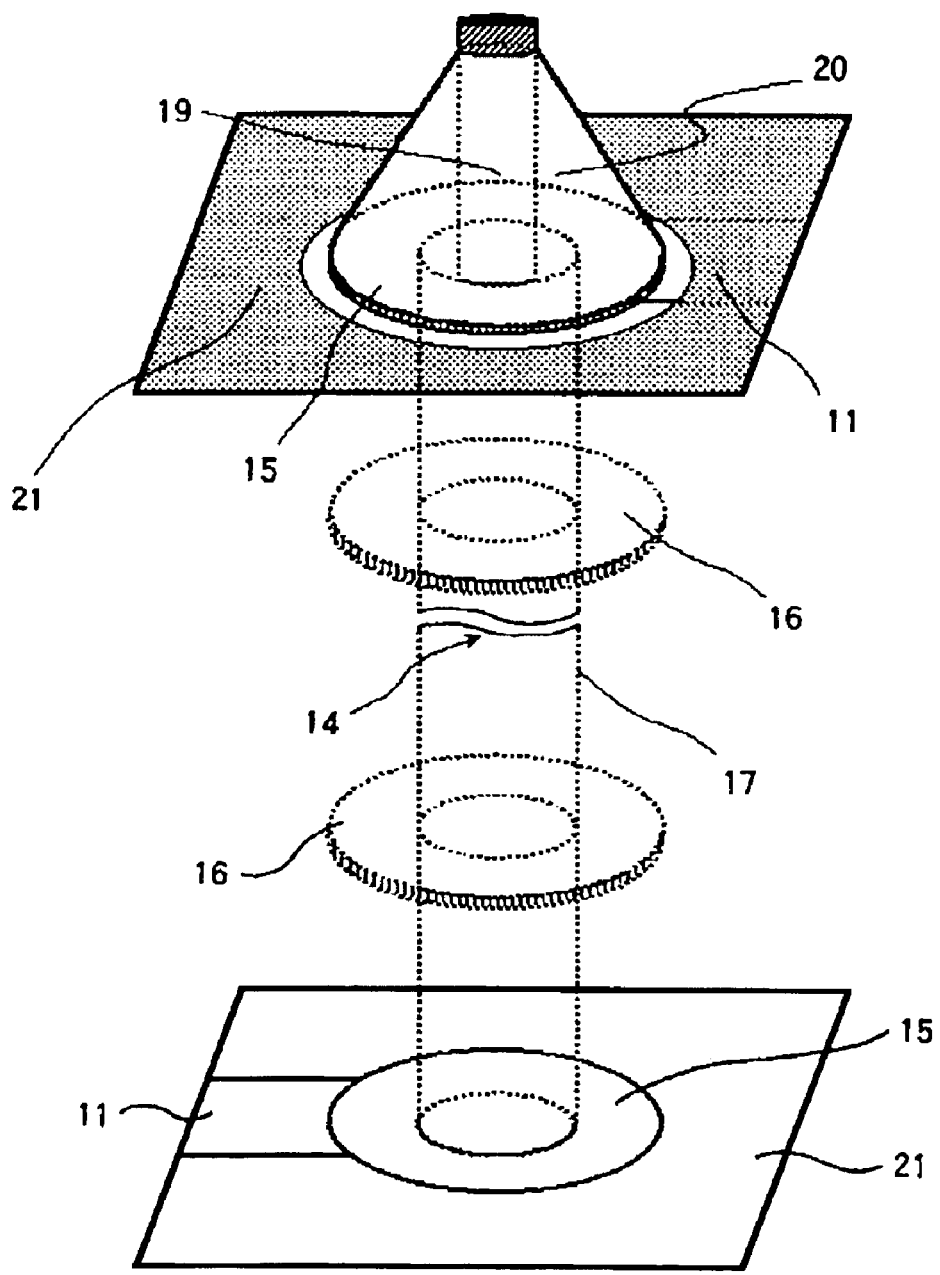
FIG. 2 is an exploded perspective view showing a positional relation between the through-hole and the internal surface lands in FIG. 1.

FIG. 1 is a cross-sectional view of a printed-wiring board 10 in accordance with the first embodiment of the present invention, on which an electronic part 18 is mounted, and FIG. 2 is an exploded perspective view showing a positional relation between a through-hole 14 and internal surface lands 16 in FIG. 1.

Hereinbelow is explained the printed-wiring board 10 in accordance with the first embodiment of the present invention, with reference to FIGS. 1 and 2.

As illustrated in FIGS. 1 and 2, the printed-wiring board 10 in accordance with the first embodiment is designed to have a multi-layered pattern structure including a first layer pattern and a N-th layer pattern (N is an integer equal to or greater than 3: $N \geq 8$) both as external surface patterns, and (N−2) internal surface patterns 12 with electrically insulating pre-pregs 13 being sandwiched between adjacent patterns.

In FIG. 1, only the first layer L1, the second layer L2, the (N−1)-th layer L(N−1), and the N-th layer LN are illustrated.

The printed-wiring board 10 is formed therethrough with a through-hole 14. An electrically conductive layer 17 composed of electrically conductive material is formed on an inner surface of the through-hole 14.

Around the through-hole 14 are formed external surface lands 15 extending radially and outwardly of the through-hole 14 and electrically connected to the external surface patterns 11, and internal surface lands 16 each extending radially and outwardly of the through-hole 14 on a level with each of the (N−2) internal surface patterns 12 and not electrically connected to the internal surface patterns 12.

The external surface lands 15 and the internal surface lands 16 are electrically connected to each other through the electrically conductive layer 17.

An insertion-type electronic part 18 is mounted on the printed-wiring board 10. An electrode 19 of the electronic part 18 is inserted into and soldered to the through-hole 14 with lead-free (Sn—Ag) solder 20.

The external surface patterns 11 are covered with solder resist 21 spaced away from the external surface lands 15.

Figure 10:
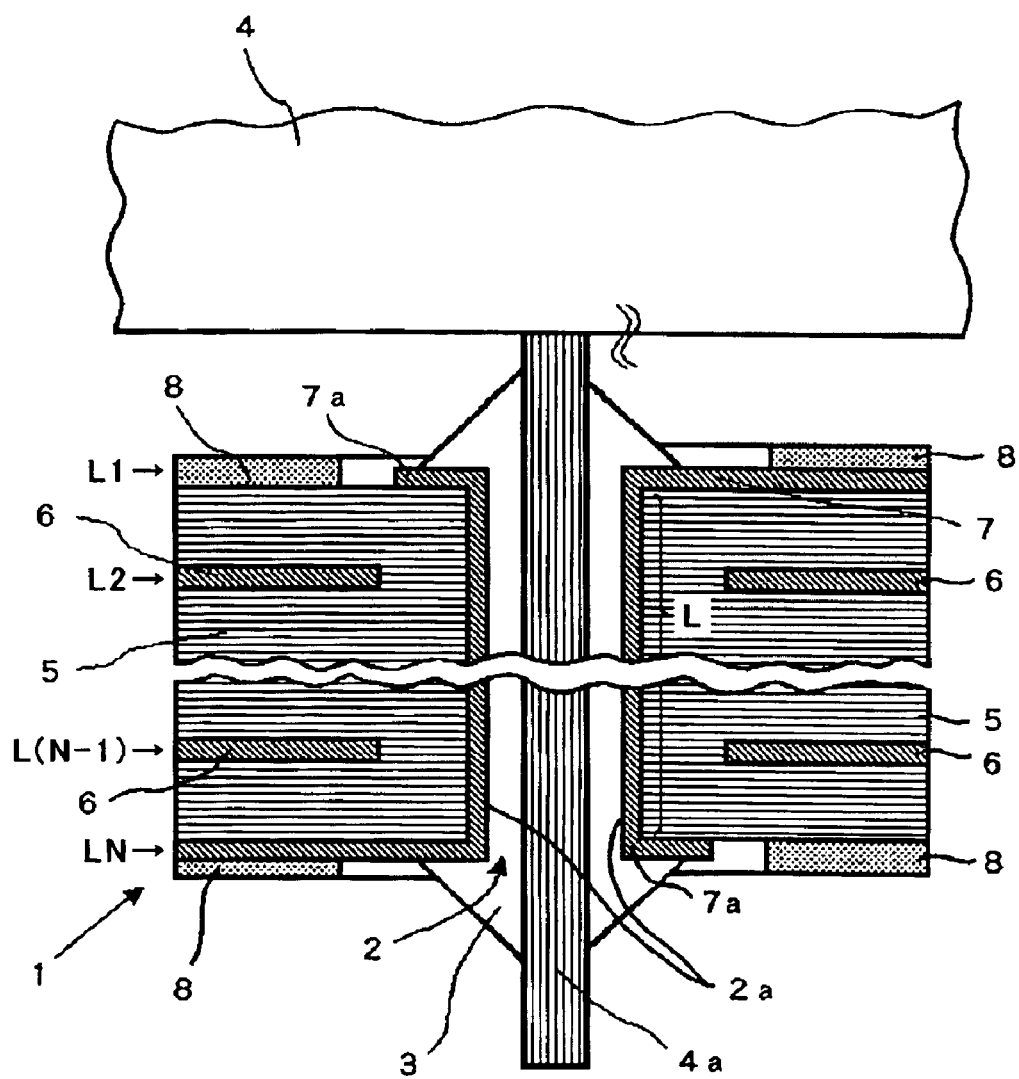
FIG. 10 is a cross-sectional view of a conventional printed-wiring board on which an electronic part is mounted.
Figure 12:
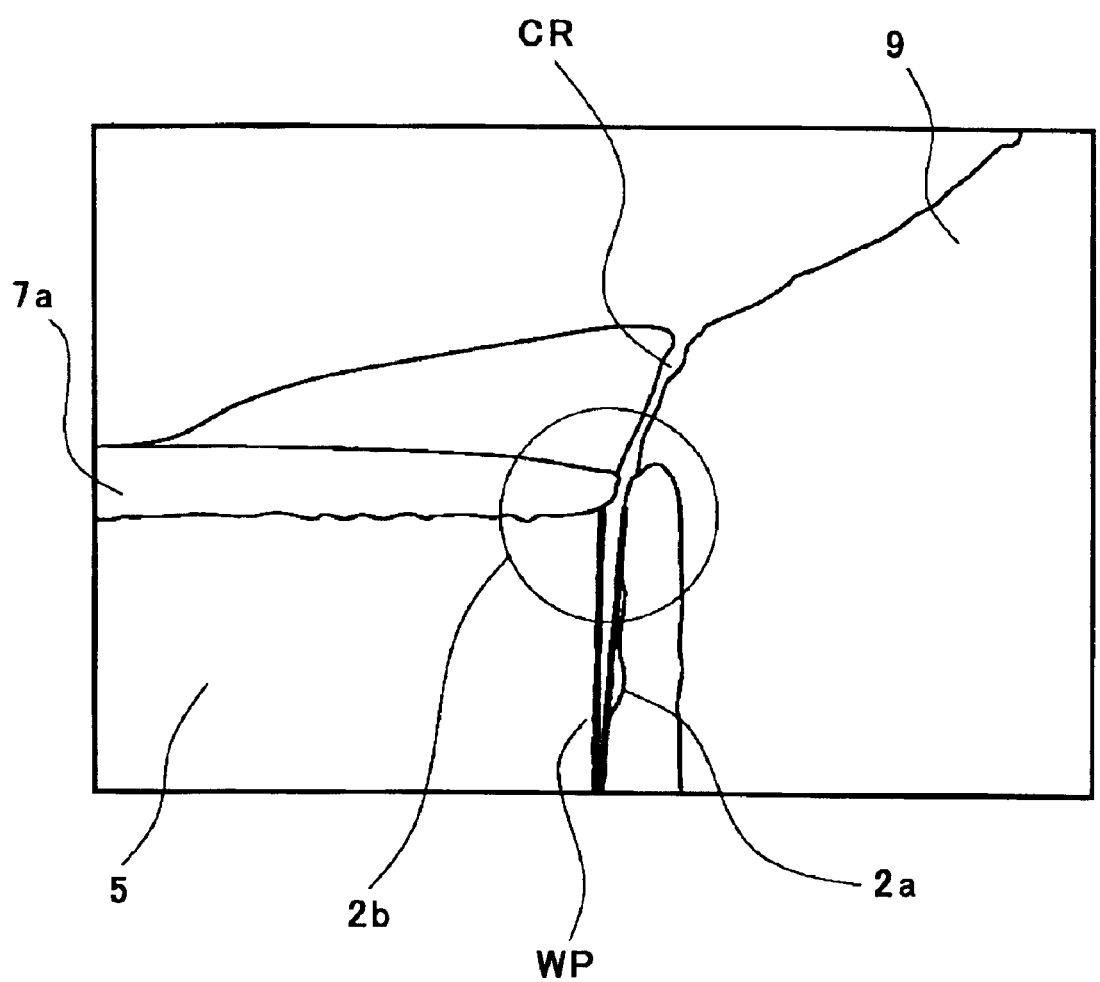
FIG. 12 is an enlarged cross-sectional view of a corner of a through-hole observed after a thermal stress cycle test was carried out to a conventional printed-wiring board.

The printed-wiring board 10 is fabricated in accordance with a subtractive process. A method of fabricating the printed-wiring board 10 is identical with a method of fabricating the conventional printed-wiring board 10 illustrated in FIG. 10, and hence, will not be explained.

In the printed-wiring board 10 in accordance with the first embodiment, the internal surface lands 16 are formed in the same layer as the internal surface pattern(s) 12 of the second layer (when N is equal to three) or the second to (N−1)-th layers (when N is equal to or greater than four) such that the internal surface lands 16 are not electrically connected to the internal surface pattern(s) 12. As a result, as illustrated in FIG. 1, a distance (hereinafter, referred to as "adhesion length L") in a width-wise direction of the printed-wiring board 10 between the external surface patterns 11 or the external surface lands 15 and the internal surface lands 16 formed on a level with the internal surface pattern 12 of the second layer or the (N−1)-th layer is shortened. The adhesion length L may be defined as a distance in a width-wise direction of the printed-wiring board 10 between a corner 22 of the through-hole 14 and the internal surface land 16 formed on a level with the second layer, or a distance in a width-wise direction of the printed-wiring board 10 between the corner 22 of the through-hole 14 and the internal surface land 16 formed on a level with the (N−1)-th layer.

By forming the internal surface lands 16 as mentioned above, it is possible to reduce shearing stress generated due to a difference in coefficients of thermal expansion in a width-wise direction of the printed-wiring board 10, and prevent generation of wall peeling-off WP by which the electrically conductive layer 17 is peeled off the pre-pregs 18. By preventing such wall peeling-off WP, it would be possible to relax concentration of stress to the corner 22 of the through-hole in the first and N-th layers, ensuring that the printed-wiring board 10 could have a structure capable of suppressing generation of crack CR.

Figure 3:
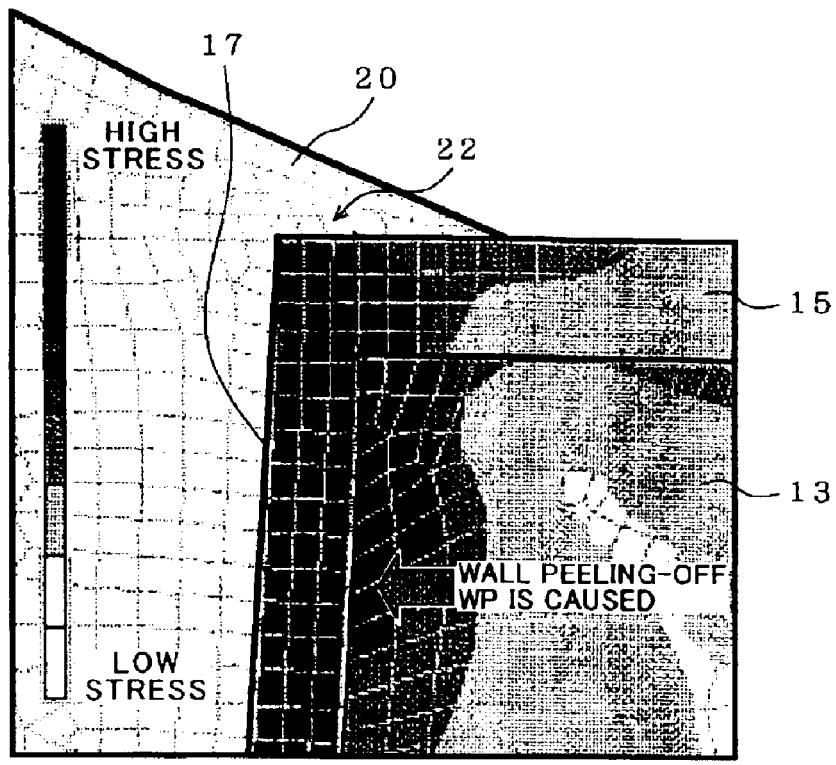
FIG. 3 shows the results of analysis of stress in the through-hole in FIG. 1.
Figure 3:
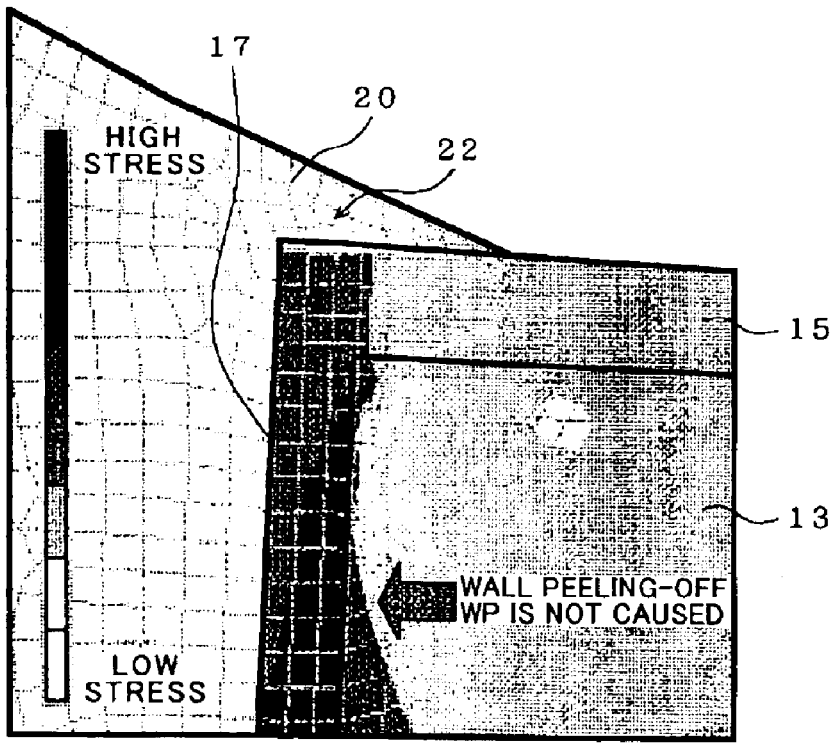

FIG. 3 shows the results of stress analysis in the through-hole 14 of the printed-wiring board 10 in accordance with the first embodiment, illustrated in FIG. 1. FIG. 3(a) is a cross-sectional view on the assumption that wall peeling-off WP is generated, and FIG. 3(b) is a cross-sectional view on the assumption that wall peeling-off WP is not generated.

As illustrated in FIG. 3, assuming that stress at the corner 22 of the through-hole is equal to one (1) when wall peeling-off WP is not generated (FIG. 3(b)), stress at the corner 22 of the through-hole observed when wall peeling-off WP is generated (FIG. 3(a)) is equal to 2.54 at 125 degrees centigrade as an upper-limit temperature of a temperature cycle test, and is equal to 2.12 at −40 degrees centigrade as a lower-limit temperature of the temperature cycle test. Specifically, the latter stress is higher than the former stress.

It is found out, based on the results of analysis of stress in the through-hole 14, that if the wall peeling-off w is suppressed, it would be possible to relax concentration of stress to the corner 22 of the through-hole.

The experiment was carried out in order to find advantages of an electronic device including the printed-wiring board 10 in accordance with the first embodiment. Hereinbelow are explained the results of the experiment, based on the data obtained in the experiment, FIG. 4 is a table showing the results of a thermal stress cycle test carried out to the printed-wiring board 10 in accordance with the first embodiment, illustrated in FIG. 1, including lead-free solder 20, and the conventional printed-wiring board 1 illustrated in FIG. 10, including lead-free solder 9.

In the test, there was used Sn—3.0Ag—0.5Cu solder as the lead-free solder 20. The lead-free solder 20 was soldered to the printed-wiring board 10 in accordance with the first embodiment and the conventional board 1 in the same conditions. Then, a thermal stress cycle test having a cycle of −40 degrees centigrade (30 minutes), 25 degrees centigrade (5 minutes), 125 degrees centigrade (30 minutes) and 25 degrees centigrade (5 minutes) was carried out to the printed-wiring boards. The numbers of the cycles having been carried out until the disconnection was caused were compared to each other.

In FIG. 4, "○" indicates that a resistance was not varied, "Δ" indicates that a resistance raised, and "X" indicates that the disconnection was caused.

The electronic part 18 was mounted on the external surface pattern 11 electrically connecting the external surface lands 15 to each other, and an electrical resistance across the external surface lands was observed. The disconnection was judged to occur when the electrical resistance became infinite.

The number of test samples was eight. For instance, "○8" indicates that a resistance was not varied in all of the eight test samples, and "X7, ○1" indicates that the disconnection was found in seven test samples among the eight test samples and a resistance was not varied in the rest, namely, the one test sample.

As the electronic part 18, there was used a connector in which wall peeling-off WP tends to occur Specifically, the used electronic part 18 was composed of polyamide resin, and had an electrode 19 having a square cross-section having sides each having a length of 0.64 mm or greater.

In accordance with the test, whereas an electrical resistance raised at the cycle number of 200 (a resistance raised at the cycle number of 200 in the one test simple, and a resistance was not varied in the seven test samples), and the disconnection was caused at the cycle number of 300 (the disconnection was caused at the cycle number of 300 in the seven test samples, and a resistance was not varied in the one test sample) in the conventional printed-wiring board 1 to which the electronic part was soldered with lead-free solder, the disconnection was not observed at all, similarly to the printed-wiring board in which an electronic part was soldered with the tin-lead eutectic solder 3 (FIG. 11), until the cycle number was over 500 and reached 1000, in the printed-wiring board 10 in accordance with the first embodiment in which the electronic part was soldered with the lead-free solder 20.

Figure 5:
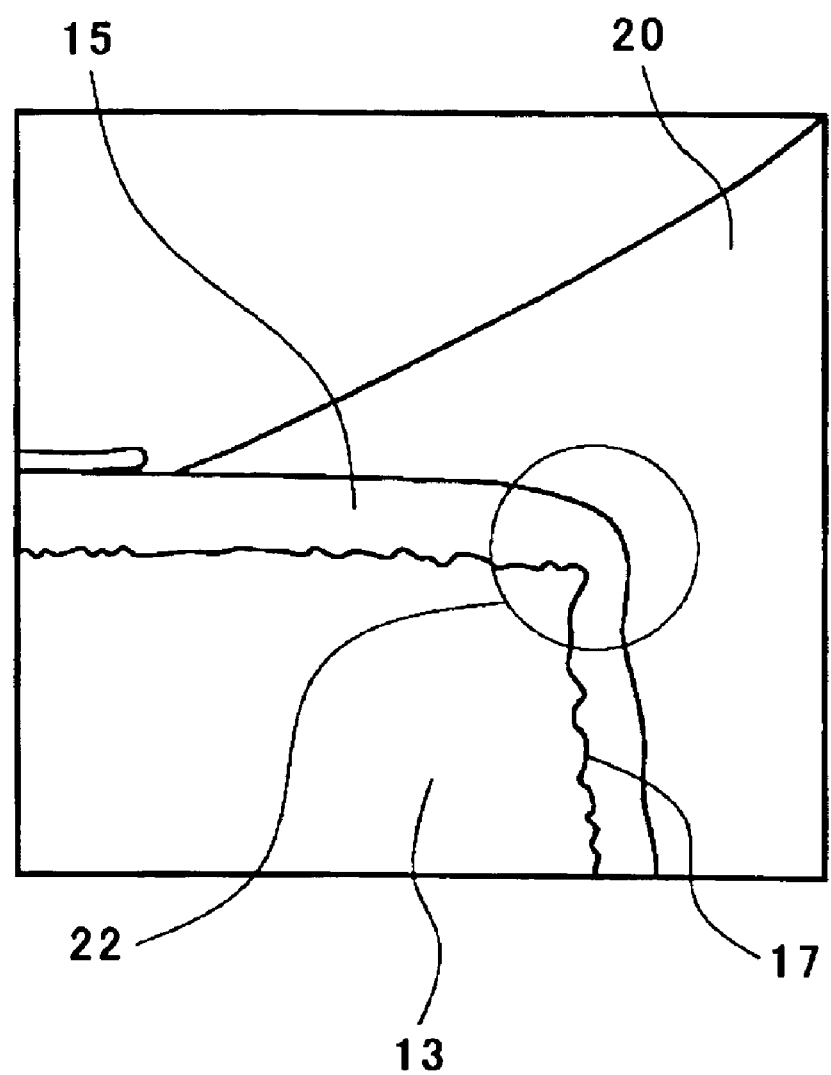
FIG. 5 is an enlarged cross-sectional view of a corner of the through-hole observed after a thermal stress cycle test was carried out to the printed-wiring board in accordance with the first embodiment, illustrated in FIG. 1, including lead-free solder.

FIG. 5 is an enlarged cross-sectional view of the corner 22 of the through-hole observed after a thermal stress cycle test was carried out to the printed-wiring board 10 in accordance with the first embodiment, illustrated in FIG. 1, including lead-free solder 20.

A thermal stress cycle test was carried out 300 cycles to the printed-wiring board 10 including the lead-free solder 20. Herein, one cycle is comprised of −40 degrees centigrade (30 minutes), room temperature (5 minutes). 125 degrees centigrade (30 minutes) and room temperature (5 minutes).

As is obvious in view of FIG. 5, no defectiveness is generated at the corner 22 of the through-hole, and no wall peeling-off WP is generated between the electrically conductive layer 17 and the pre-pregs 13 in the printed-wiring board 10.

Figure 13:
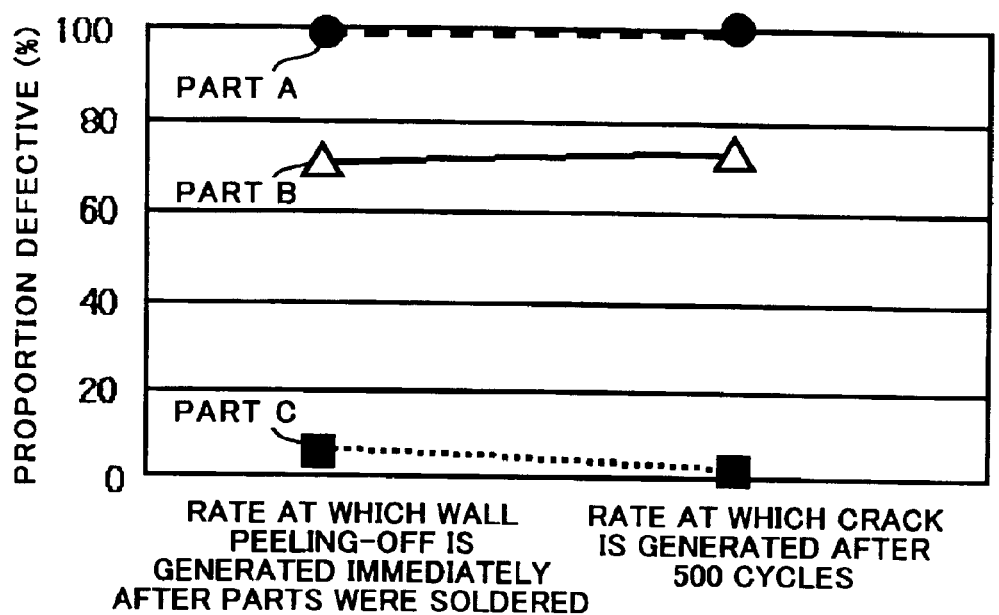
FIG. 13(a) is a graph showing a proportion defective of a conventional printed-wiring board including lead-free solder.
FIG. 13(b) is a table showing the same.
Figure 14:
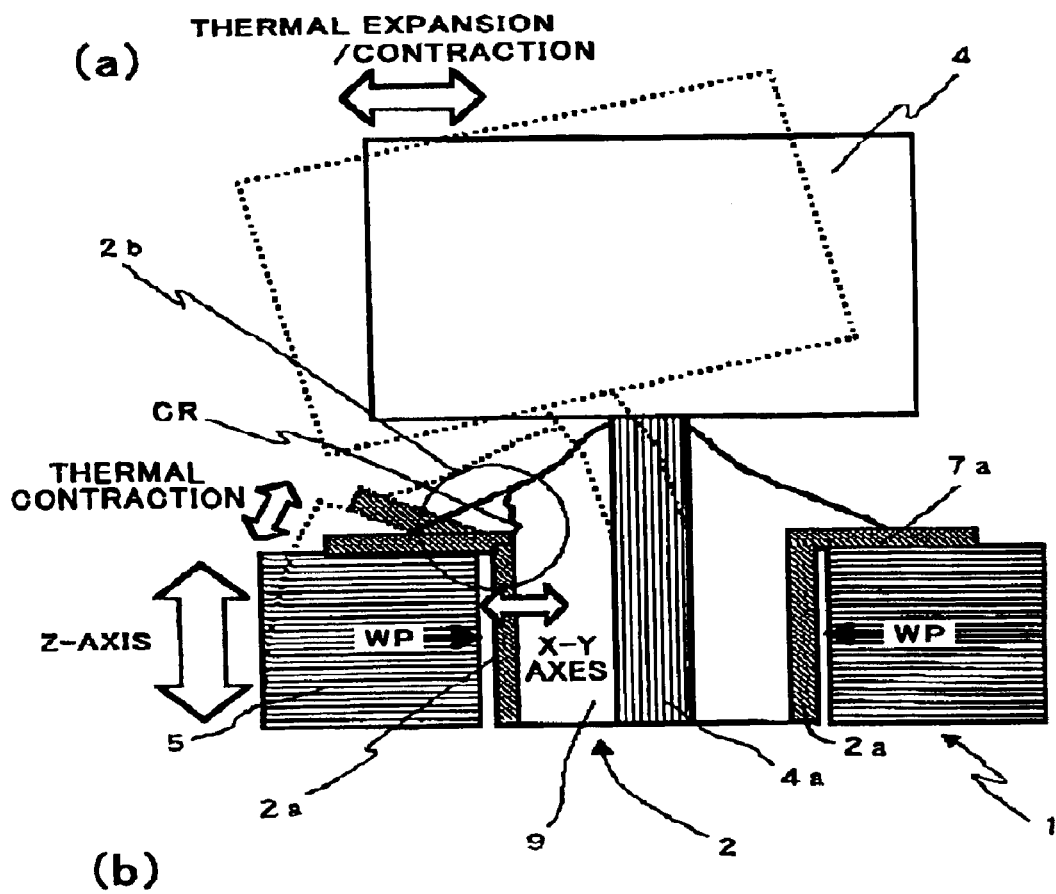
FIG. 14(a) is a cross-sectional view showing a cause by which crack is generated in a conventional printed-wiring board including lead-free solder.
FIG. 14(b) shows coefficients of thermal expansion of a printed-wiring board, an electronic part, and lead-free solder.
Figure 15:
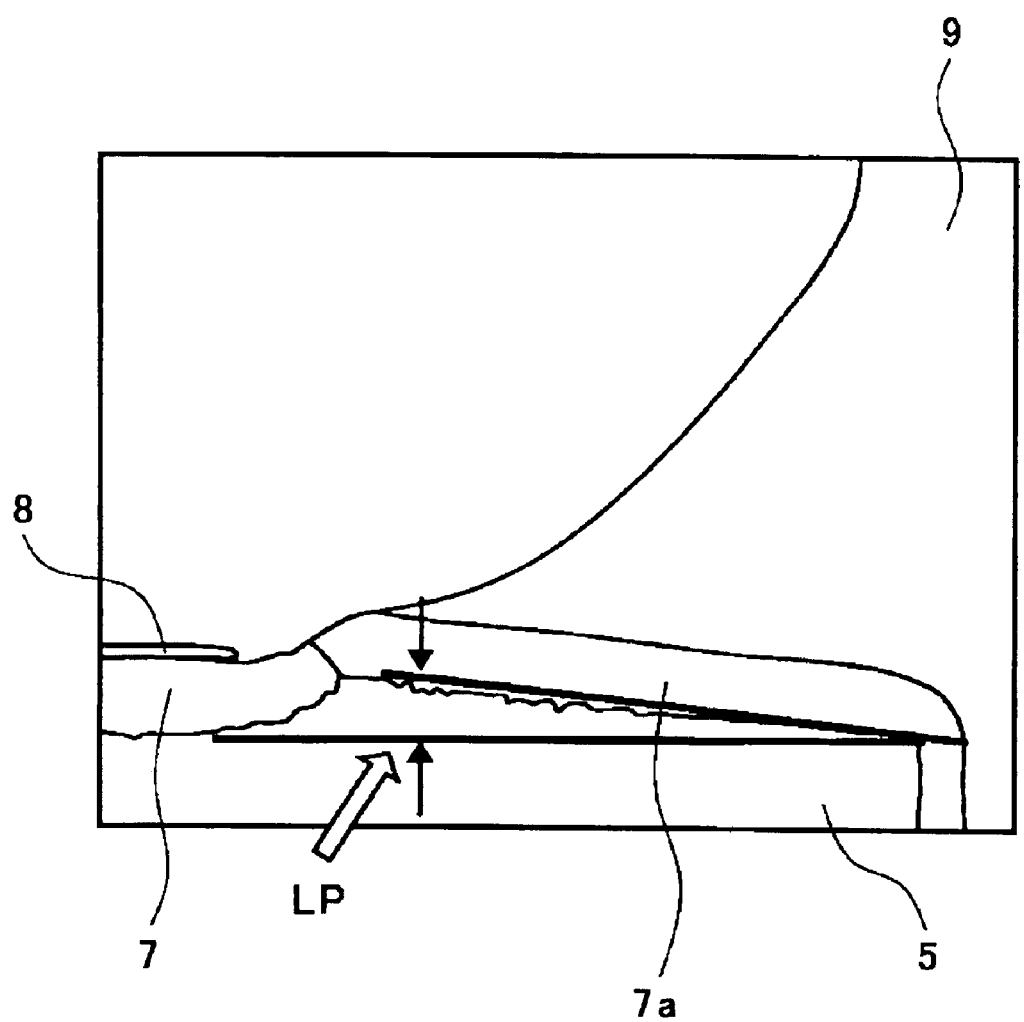
FIG. 15 is an enlarged cross-sectional view of an area in which peeling-off of land is generated in a conventional printed-wiring board including lead-free solder.
Figure 16:
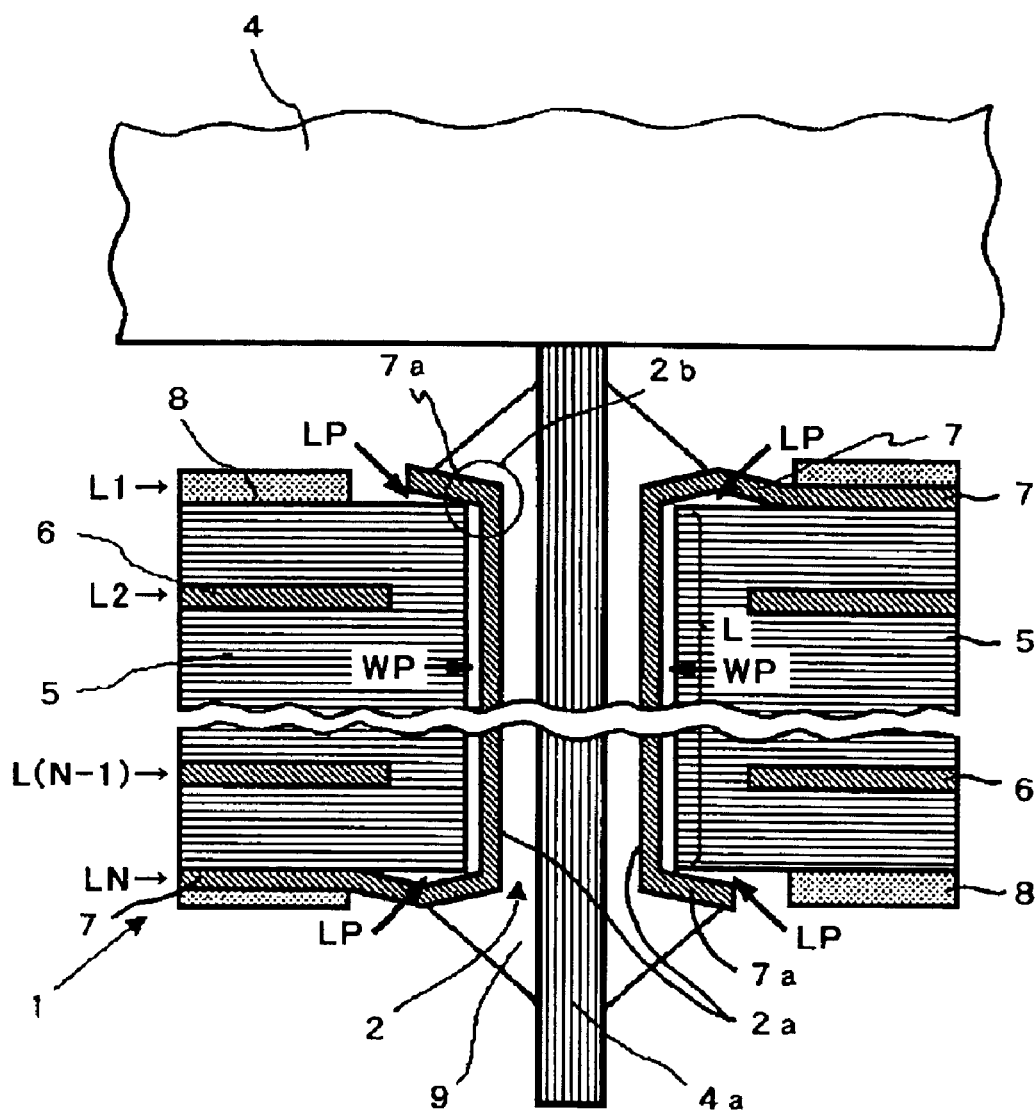
FIG. 16 is a cross-sectional view showing simultaneous generation of wall peeling-off and land peeling-off in a conventional printed-wiring board including lead-free solder.

As mentioned earlier, since there is explicit correlation between the crack CR generated at the corner 22 of the through-hole and the wall peeling-off WP (see FIG. 13), the printed-wiring board 10 has an advantage that the wall peeling-off WP can be suppressed, and the crack CR can be further suppressed at the corner 22 of the through-hole.

Furthermore, the printed-wiring board 10 and an electronic device including the printed-wiring board 10 can suppress generation of the wall peeling-off WP and the crack CR, and hence, provide high reliability without fear of disconnection.

In accordance with the experiment having been carried out by the inventors, a width of the internal surface land 16 defined as a difference between an inner radius of the through-hole 14 and an outer radius of the internal surface land 16 is preferably equal to or greater than about 0.125 mm, and is preferably equal to or smaller than about 1.5 R wherein R indicates an inner radius of the through-hole 14. It is further preferable that the internal surface land 16 has a width equal to or greater than about 0.175 mm.

The width is dependent on a margin in fabrication of the printed-wiring board 10. For instance, a plating layer constituting the electrically conductive layer 17 has a maximum thickness of about 0.025 mm, the internal surface land 16 is formed to project outwardly of the electrically conductive layer 17 by about 0.10 mm or greater.

Considering an etching accuracy and/or an accuracy at which a multi-layered structure is fabricated in fabrication of the printed-wiring board in accordance with a subtractive process, there may be generated a variance of about 0.05 mm at maximum in the width of the internal surface land 16. Though a margin of fabricating the printed-wiring board 10 may vary in dependence on manufactures of the printed-wiring board 10, a lower limit of the width of the internal surface land 16 is equal to about 0.10 mm regardless of a radius of the through-hole 14. That is, the internal surface land 16 is necessary to project outwardly of the electrically conductive layer 17 by about 0.10 mm or greater.

In contrast, the internal surface land 16 has no upper limit of the width, if the internal surface land 16 is kept electrically insulated from the electrically conductive layer 17 formed on an inner wall of the through-hole 14, with a gap of at least 0.1 mm being maintained therebetween. Accordingly, considering adhesive strength between the pre-pregs 13 and the internal surface land 16, an upper limit of the width of the internal surface land 16 may be set as high as possible.

However, if the width of the internal surface land 16 is set greater than about 1.5 R wherein R indicates a radius of the through-hole 14, a density of internal surface patterns is prevented from increasing, and a thermal capacity to be diffused by the internal surface lands 16 becomes higher than a thermal capacity of the lead-free solder 20 filled in the through-hole 14. If a thermal capacity to be diffused by the internal surface lands 16 becomes too high, a thermal capacity necessary for properly soldering an electronic part in the through-hole 14 would be in short when the lead-free solder 20 having a melting point higher and poorer wettability than those of tin-lead eutectic solder is used, resulting in that the through-hole 14 is not sufficiently wet, and thus, an electronic part is not properly soldered in the through-hole 14.

Accordingly, if an upper limit of the width of the internal surface land 16 is set equal to or smaller than about 1.5 R wherein R indicates a radius of the through-hole 14, it would be possible to properly solder an electronic part in the through-hole, because a thermal capacity of solder filled in the through-hole 14 is in proportion to a diameter of the through-hole 14

In the printed-wiring board 10 in accordance with the first embodiment, the adhesion length L starting from the corner 22 of the through-hole 14 is set equal to or smaller than about 0.5 mm. Specifically, the internal surface lands 16 of the second and (N−1)-th layers are formed such that the adhesion length L in which the electrically conductive layer 17 makes contact with the pre-pregs 13 between each of the internal surface lands 16 and the corner 22 of the through-hole is equal to or smaller than 0.5 mm.

The reason is that the through-hole 14 into which the electrode 19 of the electronic part 18 is soldered has a diameter of about 0.5 mm or greater.

It should be noted that some through-holes through which electrical signals are transmitted and into which the electronic part 18 is not inserted have a diameter smaller than 0.5 mm.

The printed-wiring board 10 is comprised primarily of the resin pre-pregs 13. In a plane of the printed-wiring board, thermal expansion/contraction observed when the electronic part is soldered into the through-hole is greater in a Z-axis direction than in X-Y axes directions. Accordingly, since lead-free solder has a higher melting point than the same of conventional Sn—64Pb solder, the printed-wiring board 10 is influenced by thermal expansion/contraction more significantly when the electronic part is soldered into the through-hole with lead-free solder than when the electronic part is soldered into the through-hole with conventional Sn—64Pb solder.

Hence, in order to relax stress acting on the electrically conductive layer 17 in the vicinity of the corner 22 of the through-hole, the adhesion length L is preferably shorter. Thus, it is preferable that a distance between the internal surface land 16 and the external surface pattern 11 is kept equal to or smaller than a diameter of the through-hole 14.

In the printed-wiring board 10 in accordance with the above-mentioned first embodiment, the internal surface land 16 is designed to be a ring having the through-hole 14 as a central hole. However, the internal surface land 16 is not to be limited to a ring in outer shape, but may have other outer shapes.

Figure 6:
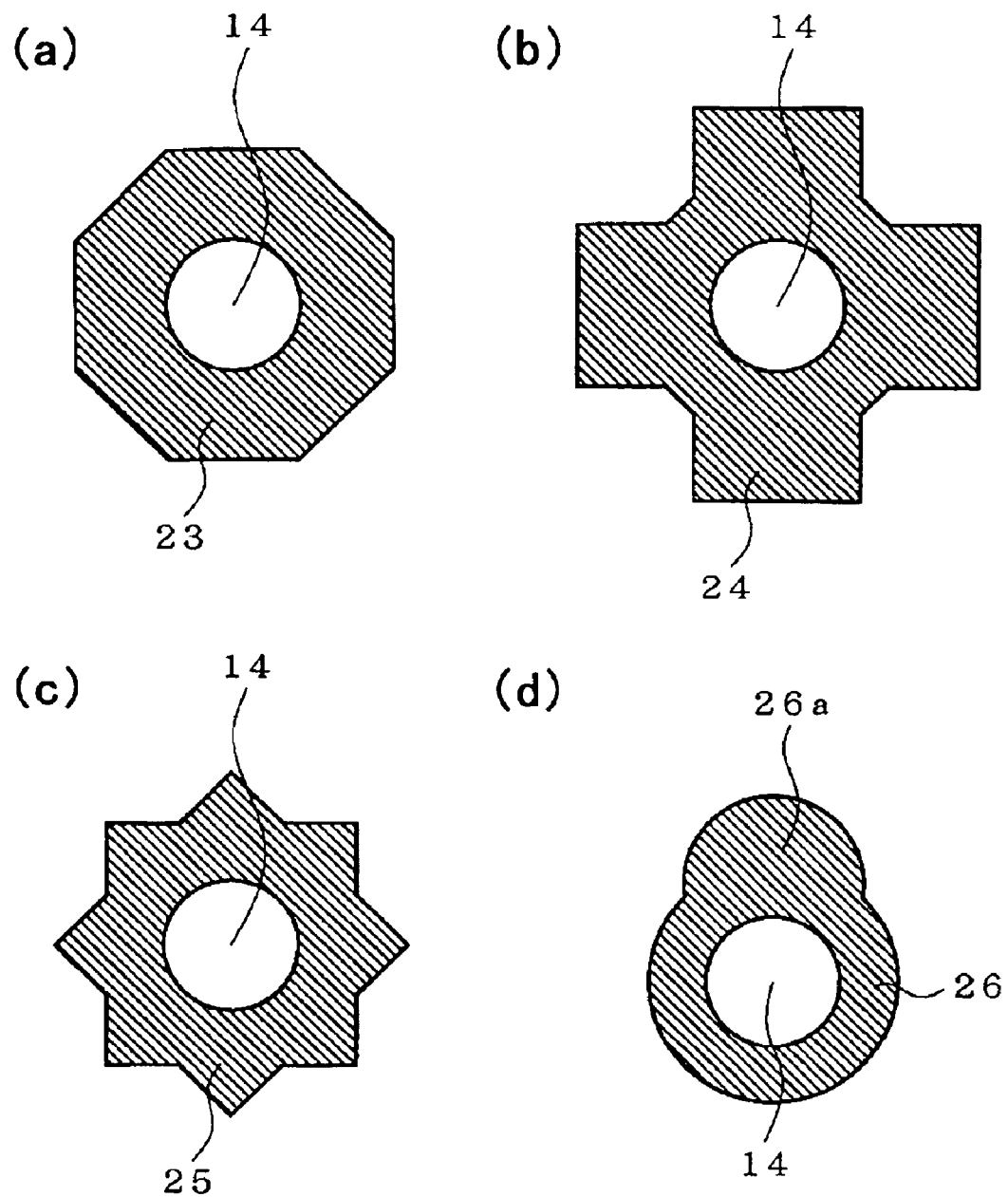
FIGS. 6(a)–6(d) are planar views each illustrating an example of the internal surface land formed in the printed-wiring board in accordance with the first embodiment, illustrated in FIG. 1.

FIG. 6 illustrates other examples of the internal surface land 16.

FIG. 6(a) illustrates a first variant of the internal surface land 16. As illustrated in FIG. 6(a), the internal surface land 16 is an octagon 23 having the through-hole 14 as a central hole. The internal surface land 16 may be designed to be other polygons such as a hexagon.

FIG. 6(b) illustrates a second variant of the internal surface land 16. As illustrated in FIG. 6(b), the internal surface land 16 may be designed to have cross-type projections 24 around the through-hole 14. The internal surface land 16 may be designed to have the projections 24 extending in two or more directions as well as the projections 24 extending in four directions, such as a cross.

FIG. 6(c) illustrates a third variant of the internal surface land 16. As illustrated in FIG. 6(c), the internal surface land 16 may be designed to be comprised of two squares 25 overlapping each other with being rotated relative to each other by 45 degrees around the through-hole 14.

FIG. 6(d) illustrates a fourth variant of the internal surface land 16. As illustrated in FIG. 6(d), the internal surface land 16 may be designed to be comprised of a ring 26 having the through-hole 14 as a central hole, and an arcuate sub-land 26a extending outwardly of the ring 26.

The sub-land 26a is not to be limited to an arcuate shape, but may have any shape.

As mentioned above, the internal surface land 16 may be comprised of a combination of lines and curves.

The internal surface land 16 may be in any planar shape, if it can shorten the adhesion length L between the electrically conductive layer 17 and the pre-pregs 13, and prevent generation of the wall peeling-off WP.

In the first embodiment, each of the internal surface lands 16 is formed in association with each of the (N−2) internal surface patterns 12. It is not always necessary for the internal surface lands 16 to be so formed, but the internal surface land 16 may be formed in association with at least one of the (N−2) internal surface patterns 12.

(Second Embodiment)

Figure 7:
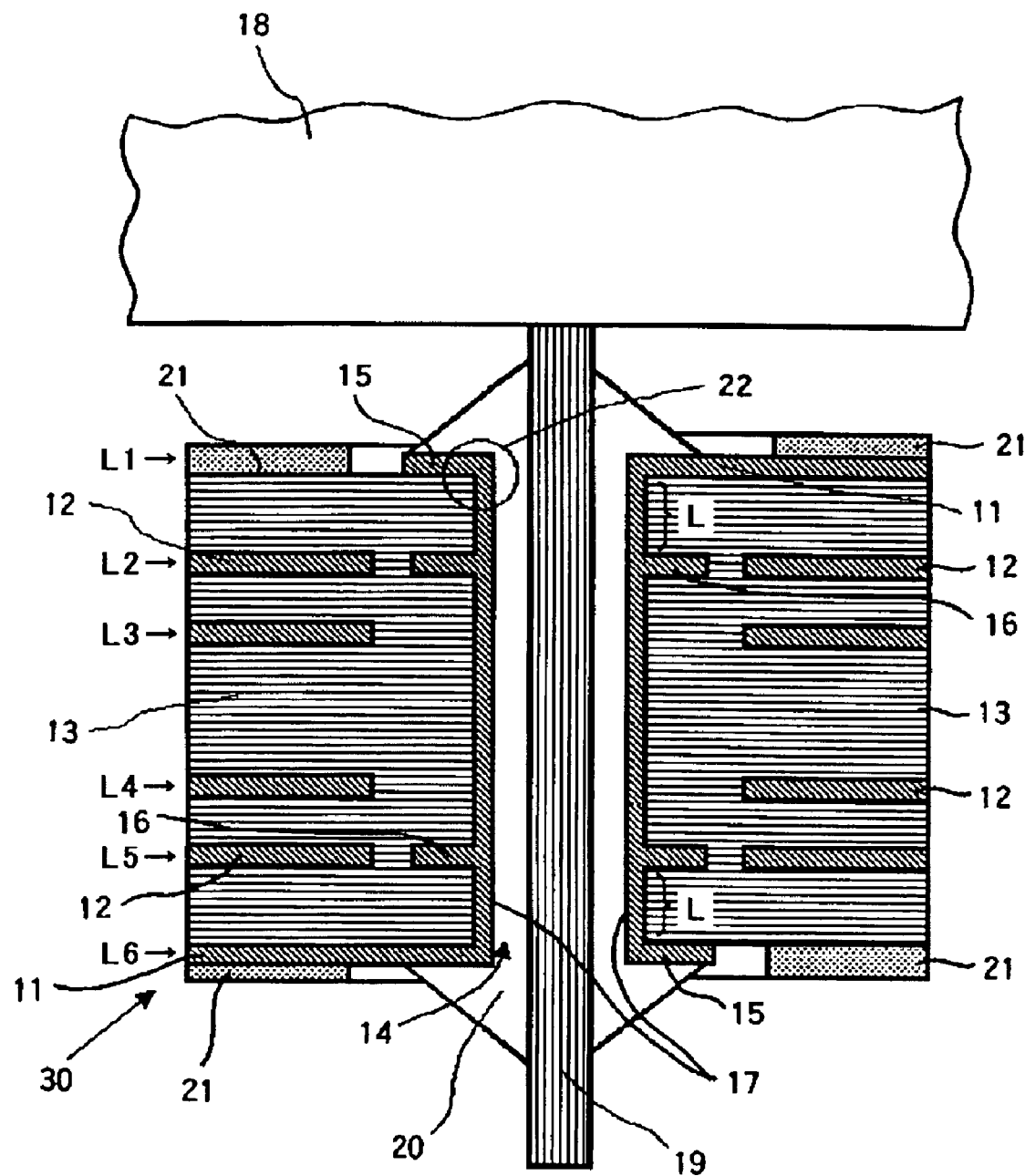
FIG. 7 is a cross-sectional view of a printed-wiring board in accordance with the second embodiment of the present invention, on which an electronic part is mounted.

FIG. 7 is a cross-sectional view of a printed-wiring board 30 in accordance with the second embodiment of the present invention, on which an electronic part 18 is mounted.

As illustrated in FIG. 7, the printed-wiring board 30 in accordance with the second embodiment has a multi-layered structure including six-layered patterns L1, L2, L3, L4, L5 and L6. In addition, in the printed-wiring board 30 in accordance with the second embodiment, the internal surface land 16 not electrically connected to the internal surface pattern 12 is not formed in association with all of the internal surface patterns 12 of the second to fifth layers L2 to L5, but the internal surface land 16 is formed in association with the selected internal surface pattern(s).

Specifically, in the printed-wiring board 30 in accordance with the second embodiment, the internal surface lands 16 are formed in association only with the internal surface patterns 12 of the second and fifth layers L2 and L5 located adjacent to the corner 22 of the through-hole 14, and are not formed in association with the internal surface patterns 12 of the third and fourth layers L3 and L4.

Except the above-mentioned difference, the printed-wiring board 80 has the same structure and operates in the same way as the printed-wiring board 10 in accordance with the first embodiment.

The printed-wiring board 30 in accordance with the second embodiment has principal purpose of relaxing concentration of stress to the corner 22 of the through-hole. Accordingly, it is most important to prevent generation of wall peeling-off WP between the fifth and sixth layers L5 and L6, and in particular between the first and second layers L1 and L2 located in the vicinity of the electronic part 18 mounted on the printed-wiring board.

Hence, in a printed-wiring board having a multi-layered structure of six or more layers, it is not always necessary to form the internal surface land 16 in association with an internal surface pattern(s) located in the vicinity of a center of the printed-wiring board in a thickness-wise direction thereof. Even so, the printed-wiring board presents sufficient reliability.

Though not illustrated, when the electronic part 18 composed of resin having a coefficient of thermal expansion not so high as that of polyamide resin, or the electronic part 18 having the electrode 19 having a diameter of about 0.5 mm or smaller is mounted on a printed-wiring board having a four-layered structure, the internal surface land 16 may be formed in association only with the second layer located in the vicinity of the corner 22 of the through-hole, because stress concentration caused by a difference in coefficients of thermal expansion of them is reduced.

As resin having a coefficient of thermal expansion not so high as that of polyamide resin, there may be used liquid crystal polymer, polybutadieneterephthalate resin, polyphenylenesulfile resin or epoxy resin.

As mentioned above, in the printed-wiring board 30 in accordance with the second embodiment, it is not always necessary to form the internal surface land 16 in association with all of the internal surface patterns 12. The internal surface land 16 may be formed in association with the selected internal surface pattern(s) 12 in accordance with a structure, reliability and/or use of the electronic part 18.

A high-current or high-frequency electric device is necessary to have a constant clearance between the through-hole 14 and the internal surface pattern 12 in the layer located in the vicinity of a center in a thickness-wise direction of a printed-wiring board, in order to maintain characteristics of the electric device. Some electric devices cannot have such a clearance, if the internal surface land 16 is formed in the printed-wiring board. The printed-wiring board 30 in accordance with the second embodiment is suitable to such electric devices.

(Third Embodiment)

Figure 8:
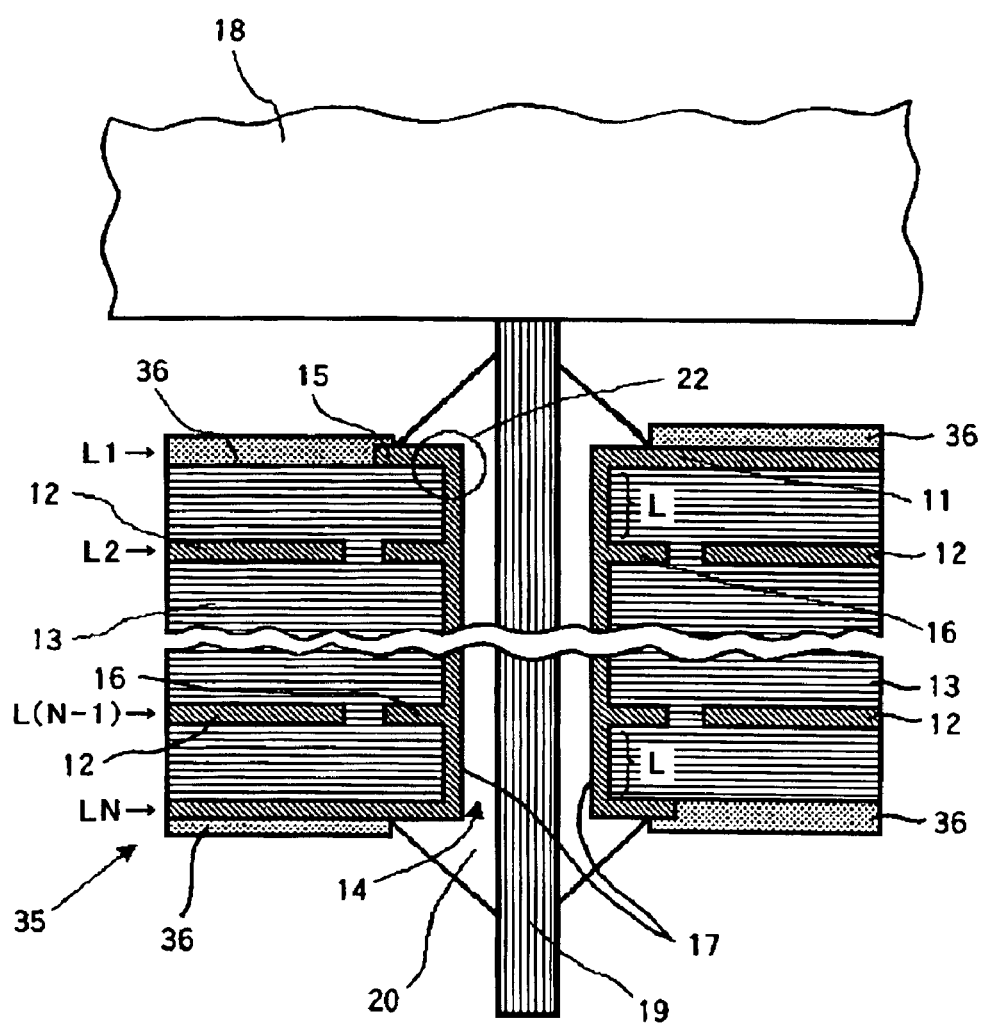
FIG. 8 is a cross-sectional view of a printed-wiring board in accordance with the third embodiment of the present invention, on which an electronic part is mounted.

FIG. 8 is a cross-sectional view of a printed-wiring board 35 in accordance with the third embodiment of the present invention, on which an electronic part 18 is mounted.

As illustrated in FIG. 1, the solder resist 21 is spaced away from the external surface land 15 in the printed-wiring board 10 in accordance with the first embodiment. In contrast, as illustrated in FIG. 8, solder resist 36 is formed so as to partially overlap ends of the external surface lands 15 defining the first and N-th layers in the printed-wiring board 35 in accordance with the third embodiment.

The printed-wiring board 35 in accordance with the third embodiment has the same structure as that of printed-wiring board 10 in accordance with the first embodiment except the above-mentioned matter.

The printed-wiring board 35 in accordance with the third embodiment can suppress both of the land peeling-off LP and the wall peeling-off WP by which the external surface lands 15 are peeled off the pre-pregs 13 and which are frequently found in a printed-wiring board to which an electronic part is soldered with lead-free solder 20.

Figure 9:
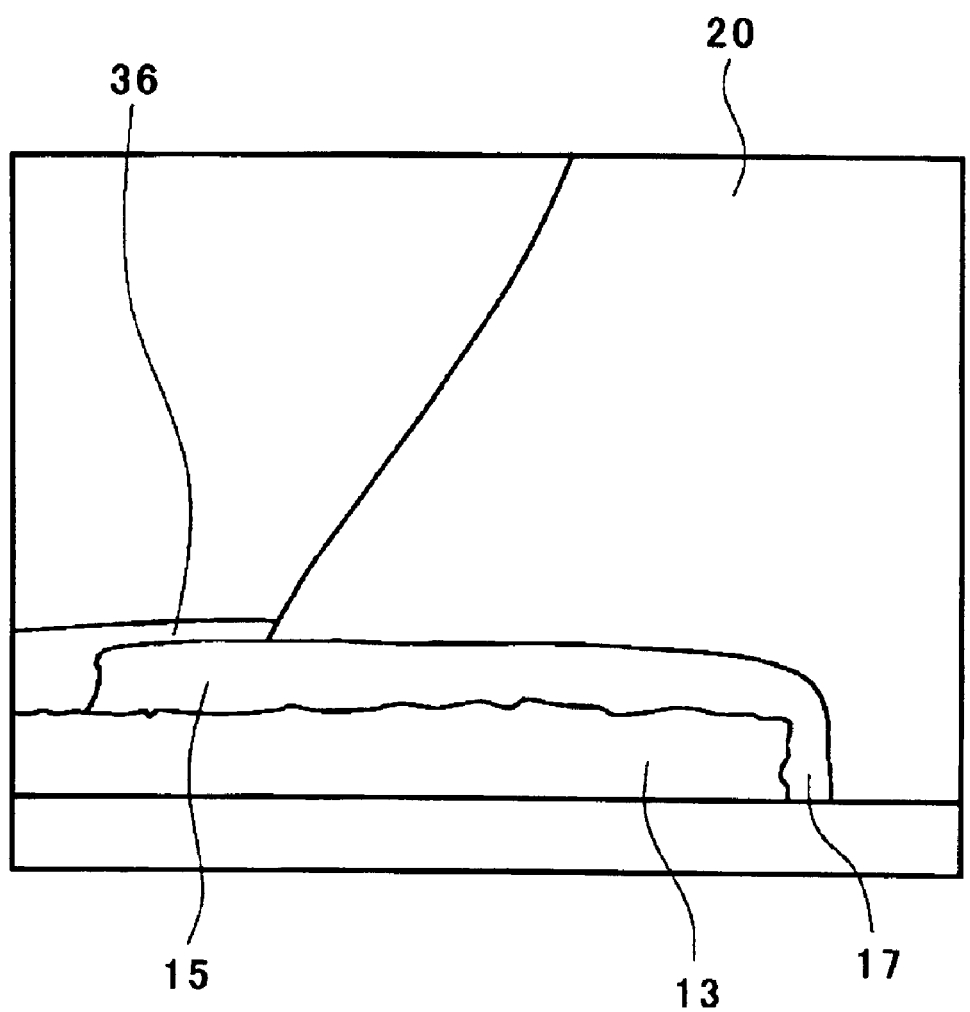
FIG. 9 is an enlarged cross-sectional view of a corner of the through-hole observed after a thermal stress cycle test was carried out to the printed-wiring board in accordance with the third embodiment, illustrated in FIG. 8, including lead-free solder.

FIG. 9 is an enlarged cross-sectional view of the corner 22 of the through-hole observed after a thermal stress cycle test was carried out to the printed-wiring board 35 in accordance with the third embodiment, illustrated in FIG. 8, including the lead-free solder 20.

The thermal stress cycle test was carried out 300 cycles to the printed-wiring board 35 including the lead-free solder 20. One cycle is comprised of −40 degrees centigrade (30 minutes), room temperature (5 minutes), 125 degrees centigrade (30 minutes) and room temperature (5 minutes).

By covering the external surface land 15 at an end thereof with the solder resist 36, as illustrated in FIG. 9, the solder resist 36 prevents the lead-free solder 20 from extending to the end of the external surface land 15. As a result, a stress acting on the end of the external surface land 15 is relaxed, and thus, it would be possible to prevent generation of land peeling-off LP.

By further forming the internal surface land(s) 16 in association with the internal surface patterns in no electrical connection, it would be possible to prevent generation of wall peeling-off WP between the electrically conductive layer 17 and the pre-pregs 13.

Specifically, the printed-wiring board 35 in accordance with the third embodiment is designed to have a structure for covering the external surface land 15 at an end thereof with the solder resist 36, and a structure for forming the internal surface land(s) 16 in association with the internal surface patterns in no electrical connection, and hence, can prevent continuous peeling-off between the external surface land 15 and the electrically conductive layer 17. As a result, the printed-wiring board 35 can prevent disconnection and provide high reliability.

Similarly to the above-mentioned second embodiment, the internal surface land 16 is formed in association with a selected internal surface pattern(s). It is not always necessary to form the internal surface land 16 in association with all of the internal surface patterns 12.

In a printed-wiring board having a multi-layered structure of six or more layers, it is not always necessary to form the internal surface land 16 in association with an internal surface pattern(s) located in the vicinity of a center of the printed-wiring board in a thickness-wise direction thereof.

By having the structure for at least partially covering the external surface lands 15 of the first and N-th layers at their ends with the solder resist 36, and the structure for forming the internal surface land(s) 16 in association with the internal surface pattern(s) 12, the printed-wiring board 35 can prevent generation of both of wall peeling-off WP and land peeling-off LP. Hence, even if the lead-free solder 20 is used, it would be possible to present an electronic device providing highly sufficient reliability without disconnection.

The external surface land 15 and the internal surface land 16 are not to be limited in shape to a ring having the through-hole 14 as a central hole. They may have any shape, if a minimum width of the external surface land 15 and the internal surface land 16 is equal to or greater than about 0.125 mm.

In accordance with the above-mentioned first to third embodiments, at least one internal surface land 16 having no electrical connection with the internal surface pattern 12 is formed around the through-hole 14 in the printed-wiring boards 10, 30 and 35 which are fabricated in accordance with a subtractive process and into which the insertion-type electronic part 18 is soldered with the lead-free solder 20. By forming the internal surface land 16, it would be possible to prevent generation of the wall peeling-off WP, and further prevent generation of the crack CR at the corner 22 of the through-hole.

The internal surface land 16 is designed to have a width equal to or greater than about 0.125 mm and equal to or smaller than about 1.5 R wherein R indicates an inner radius of the through-hole 14, ensuring that a plane along which the electrically conductive layer 17 and the pre-pregs 13 are adhered to each other is divided into portions in a thickness-wise direction (Z-axis direction) of the printed-wiring board, and the adhesion length L starting from the corner 22 is equal to or smaller than about 0.5 mm.

By partitioning the adhesion length L into portions, it would be possible to reduce shearing stress caused by a difference in a coefficient of thermal expansion per an adhesion length L, and further reduce an area in which the electrically conductive layer 17 and the pre-pregs 13 are adhered to each other by anchor effect. As a result, it is possible to prevent generation of the wall peeling-off WP between the electrically conductive layer 17 and the pre-pregs 13.

In addition, by preventing generation of the wall peeling-off WP, it would be possible to relax stress concentration to the corner 22 of the through-hole at a surface of the printed-wiring board, and thus, suppress generation of the crack CR.

Furthermore, by forming the internal surface land 16 in the second and (N−1)-th layers located adjacent to the corner 22 of the through-hole, in particular, in the second layer above which the electronic part 18 is mounted, it would be possible to prevent disconnection caused by the crack CR generated at the corner 22 of the through-hole.

It was found out that an electronic device including the printed-wiring board 10, 30 or 35 in accordance with the first to third embodiments has a lifetime longer than the same of an electronic device including a conventional printed-wiring board even in repeated thermal stress cycles. This indicates that the electronic device can provide high reliability, even if it includes the lead-free solder 20.

While the present invention has been described in connection with certain preferred embodiments, it is to be understood that the subject matter encompassed by way of the present invention is not to be limited to those specific embodiments. On the contrary, it is intended for the subject matter of the invention to include all alternatives, modifications and equivalents as can be included within the spirit and scope of the following claims.

The entire disclosure of Japanese Patent Application No. 2002-009807 filed on Jan. 18, 2002 including specification, claims, drawings and summary is incorporated herein by reference in its entirety.

What is claimed is:

1. A board having a multi-layered pattern structure comprised of N layer patterns electrically insulated from one another wherein N is an integer equal to or greater than 3, wherein the multi-layered pattern structure is formed with a through-hole, into which an electrode of an electronic part is to be inserted, an external land is formed on a surface of each of the first and N-th layer patterns, an electrically conductive layer is formed on an inner wall of the through-hole such that the electrically conductive layer is electrically connected to the external land of each of the first and N-th layer patterns, the electronic part is fixed in the through-hole with lead-free solder filled in the through-hole, and at least one internal land extending inwardly of the multi-layered pattern structure from the electrically conductive layer is formed in the same layer as a M-th layer pattern (2=<M=<(N−1)) such that the internal land is not electrically connected to the M-th layer pattern;

wherein, the internal land is in the form of a ring including the through-hole as a central opening, and the internal land has a width equal to or greater than about 0.10 mm and equal to or smaller than 1.5 R wherein the width is defined as a difference between a radius of the through-hole and an outer radius of the internal land and R indicates a radius of the through-hole.

2. The board as set forth in claim 1, wherein the width of the internal land is equal to or greater than about 0.175 mm.

3. The board as set forth in claim 2, wherein the width of the internal land is equal to or greater than about 0.175 mm.

4. The board as set forth in claim 1, wherein at least one of a distance in a length-wise direction of the through-hole between the first layer pattern and the internal land formed in the same layer as the second layer pattern, and a distance in a length-wise direction of the through-hole between the N-th layer pattern and the internal land formed in the same layer as the (N−1)-th layer pattern is equal to or smaller than 0.5 mm.

5. The board as set forth in claim 1, wherein a distance in a length-wise direction of the through-hole between adjacent internal lands is equal to or smaller than a diameter of the through-hole.

6. The board as set forth in claim 1, wherein the internal land is formed only in the same layer as the second layer pattern.

7. The board as set forth in claim 1, wherein the internal land is formed in the same layers as the second and the (N−1)-th layer patterns.

8. The board as set forth in claim 1, further comprising solder resist covering at least a part of an end of the external land therewith.

9. The board as set forth in claim 1, wherein the multi-layered pattern structure is fabricated in accordance with a subtractive process.

10. An electronic device including a board having a multi-layered pattern structure comprised of N layer patterns electrically insulated from one another wherein N is an integer equal to or greater than 3, wherein the multi-layered pattern structure is formed with a through-hole, into which an electrode of an electronic part is to be inserted, an external land is formed on a surface of each of the first and N-th layer patterns, an electrically conductive layer is formed on an inner wall of the through-hole such that the electrically conductive layer is electrically connected to the external land of each of the first and N-th layer patterns, the electronic part is fixed in the through-hole with lead-free solder filled in the through-hole, and at least one internal land extending inwardly of the multi-layered pattern structure from the electrically conductive layer is formed in the same layer as a M-th layer pattern (2=<M<(N−1)) such that the internal land is not electrically connected to the M-th layer pattern;

wherein the internal land is in the form of a ring including the through-hole as a central opening, and the internal land has a width equal to or greater than about 0.10 mm and equal to or smaller than 1.5 R wherein the width is defined as a difference between a radius of the through-hole and an outer radius of the internal land and R indicates a radius of the through-hole.

11. The electronic device as set forth in claim 10, wherein the width of the internal land is equal to or greater than about 0.125 mm.

12. The electronic device as set forth in claim 10, wherein at least one of a distance in a length-wise direction of the through-hole between the first layer pattern and the internal land formed in the same layer as the second layer pattern, and a distance in a length-wise direction of the through-hole between the N-th layer pattern and the internal land formed in the same layer as the (N−1)-th layer pattern is equal to or smaller than 0.5 mm.

13. The electronic device as set forth in claim 10, wherein a distance in a length-wise direction of the through-hole between adjacent internal lands is equal to or smaller than a diameter of the through-hole.

14. The electronic device as set forth in claim 10, wherein the internal land is formed only in the same layer as the second layer pattern.

15. The electronic device as set forth in claim 10, wherein the internal land is formed in the same layers as the second and the (N−1)-th layer patterns.

16. The electronic device as set forth in claim 10, further comprising solder resist covering at least a part of an end of the external land therewith.

* * * * *